(12) United States Patent
Yoo

(10) Patent No.: US 11,398,846 B2
(45) Date of Patent: Jul. 26, 2022

(54) TRANSCEIVER HAVING ANTENNA-CONNECTION PORT AND FEM-CONNECTION PORT

(71) Applicant: Dialog Semiconductor Korea Inc., Seongnam-si (KR)

(72) Inventor: Hee Yong Yoo, Seongnam-si (KR)

(73) Assignee: Dialog Semiconductor Korea Inc., Gyeonggi-Do (KR)

( * ) Notice: Subject to any disclaimer, the term of this patent is extended or adjusted under 35 U.S.C. 154(b) by 267 days.

(21) Appl. No.: 16/699,655

(22) Filed: Dec. 1, 2019

(65) Prior Publication Data

US 2020/0287584 A1    Sep. 10, 2020

(30) Foreign Application Priority Data

Mar. 8, 2019   (KR) .......................... 10-2019-0026665

(51) Int. Cl.
*H03F 3/24* (2006.01)
*H04B 1/44* (2006.01)

(52) U.S. Cl.
CPC ............... *H04B 1/44* (2013.01); *H03F 3/245* (2013.01); *H03F 2200/294* (2013.01); *H03F 2200/451* (2013.01); *H03F 2200/541* (2013.01)

(58) Field of Classification Search
CPC .................................. H04B 1/44; H03F 3/245
See application file for complete search history.

(56) References Cited

U.S. PATENT DOCUMENTS

| 7,982,664 | B1* | 7/2011 | Uscinowicz | H01Q 3/267 342/174 |
| 8,422,540 | B1* | 4/2013 | Negus | H01Q 21/062 375/219 |
| 10,432,247 | B2* | 10/2019 | Pawliuk | H04W 56/002 |
| 2011/0065400 | A1* | 3/2011 | Teikari | H01Q 1/243 455/129 |
| 2011/0234321 | A1* | 9/2011 | Jeong | H03F 1/22 330/295 |
| 2016/0276983 | A1* | 9/2016 | Vaillancourt | H04B 1/18 |
| 2018/0226932 | A1* | 8/2018 | Beaudin | H03F 3/72 |
| 2018/0261566 | A1* | 9/2018 | Babcock | H01L 25/18 |
| 2020/0083924 | A1* | 3/2020 | Callender | H03F 1/565 |

FOREIGN PATENT DOCUMENTS

| KR | 20090075078 | 7/2009 |
| KR | 10-2014-0093053 | 7/2014 |
| KR | 10-1428061 | 8/2014 |

OTHER PUBLICATIONS

Korean Office Action, Notice of Preliminary Rejection, Application No. 10-2019-0026665, Applicant: Dialog Semiconductor Korea Inc., dated Jan. 30, 2020, 4 pages.

\* cited by examiner

*Primary Examiner* — Patricia T Nguyen
(74) *Attorney, Agent, or Firm* — Saile Ackerman LLC; Stephen B. Ackerman

(57) ABSTRACT

A transceiver having an antenna-connection port and an FEM-connection port is disclosed.
Exemplary embodiments provide a transceiver having an antenna-connection port and an FEM-connection port that may support a connection to an external FEM and also support a connection to an antenna without a separate RF switch when an antenna is used without an FEM.

8 Claims, 8 Drawing Sheets

(a)

(b)

(a)

(b)

(a)

(b)

TRANSCEIVER HAVING ANTENNA-CONNECTION PORT AND FEM-CONNECTION PORT

RELATED APPLICATION

This application claims the benefit of priority of Korean Patent Application No. 10-2019-0026665 filed on Mar. 8, 2019, the contents of which are incorporated herein by reference in their entirety.

FIELD AND BACKGROUND OF THE INVENTION

One or more exemplary embodiments relate to a transceiver having an antenna-connection port and an FEM-connection port.

The following description merely provides background information related to the exemplary embodiments and does not constitute the related art.

With the development of various wireless communication technologies such as mobile communication, near field communication, and data communication, wireless communication systems have been used in various fields of society. A wireless communication system wirelessly transmits and receives audio, image, and multimedia data through mutually agreed channels according to determined specifications. An RF communication device for wirelessly transmitting and receiving signals is a basic device required to perform wireless communication.

Among RF communication devices, an RF communication device requiring high-power signals as in WiFi sensitively responds to a change in a surrounding transceiving environment. In particular, the reception performance of the RF communication device may degrade in an area near an access point, or an area near a base station where a received signal strength is excessively high.

As shown in FIG. 1, general WiFi chips in a communication device need to use an external RF switch to share a single antenna for reception (Rx) and transmission (Tx). Further, the general WiFi chips need to use a separate front-end module (FEM) to improve the Rx and Tx performances when performing Rx and Tx by sharing the single antenna.

SUMMARY OF THE INVENTION

An aspect is to provide a transceiver having an antenna-connection port and an FEM-connection port that may support a connection to an external FEM and also support a connection to an antenna without using a separate RF switch when an antenna is used without an FEM.

According to an aspect, a transceiver including an input/output common port (Rx/Tx Port) configured to receive an Rx signal or to output a Tx signal by connecting to an antenna (ANT), or to output the Tx signal by connecting to a Tx input terminal of a front-end module (FEM); an input only port (Rx Port) configured to receive the Rx signal by connecting to an Rx output port of the FEM; a low-noise amplifier (LNA) configured to form a plurality of Rx paths by connecting to the input/output common port and to the input only port respectively, and configured to amplify and output the Rx signal after receiving the Rx signal using the plurality of Rx paths; a power amplifier (PA) configured to form a Tx path by connecting to the input/output common port, and configured to apply the Tx signal to the input/output common port using the Tx path; and a plurality of switching devices configured to form the Tx path and the plurality of Rx paths by performing switching between the PA and the LNA and between the input/output common port and the input only port respectively.

EFFECT

As described above, according to exemplary embodiments, it is possible to support a connection to an external FEM in a transceiver and also support a connection to an antenna without a separate RF switch when the antenna is used without an FEM.

According to exemplary embodiments, it is possible to enable Rx and Tx by providing a port to receive an Rx signal, and a port to output a Tx signal or to receive an Rx signal separately in a transceiver and sharing a single antenna through switching of a plurality of RF switches.

According to exemplary embodiments, it is possible to reduce a cost for RF switch devices when manufacturing modules through reduction of a module area for RF switch devices to be used by providing RF switches in a WiFi system on chip (SoC) supporting 5G bands.

According to exemplary embodiments, it is possible to provide a transceiver with 5-6 GHz band that may control switching using a single LNA, a plurality of RF switches (for example, at least one to five switches), and two pins (ANT/TX out and RX Input).

DETAILED DESCRIPTION OF EMBODIMENTS

Hereinafter, exemplary embodiments will be described in detail with reference to the accompanying drawings.

Figure 1:
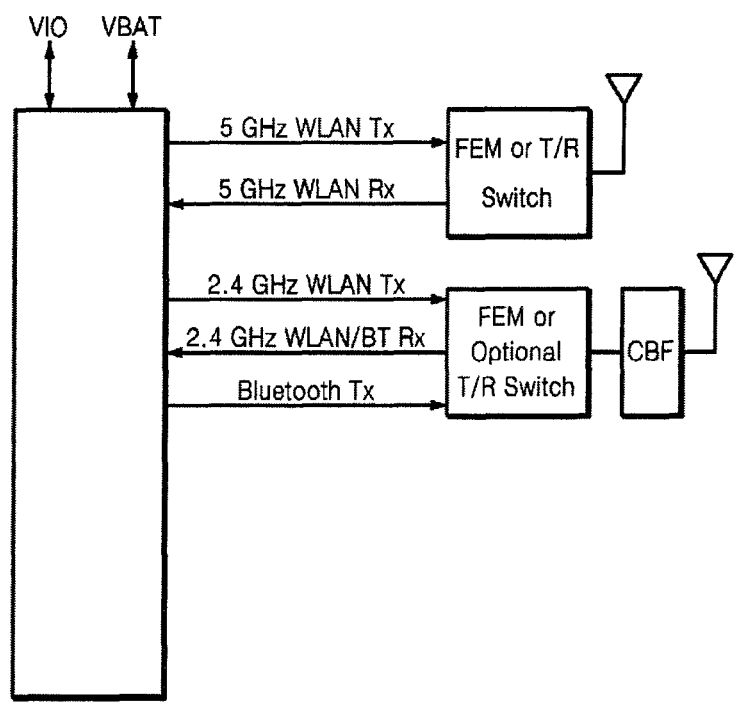
FIG. 1 illustrates a general transceiver.
Figure 2:
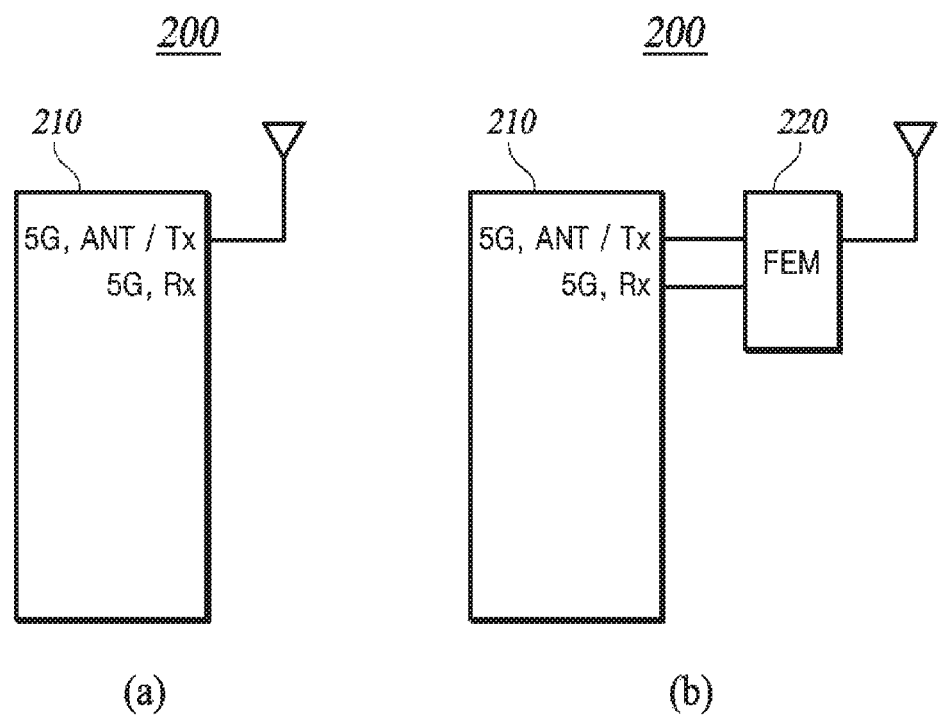
FIG. 2 illustrates a transceiver according to an exemplary embodiment.

FIG. 2 illustrates a transceiver according to an exemplary embodiment.

A transceiver module 200 is manufactured by including an RF switch function in a transceiver 210 with 5-GHz band and thus, may transmit and receive signals in a 5-6 GHz band.

As shown in (a) of FIG. 2, the transceiver module 200 includes an input/output common port (Rx/Tx Port) 302, which is a port in which Rx and Tx are combined in the transceiver 210 to share a single antenna.

As shown in (b) of FIG. 2, when the transceiver module 200 includes a front-end module (FEM) 220 connecting to the transceiver 210, the input/output common port (Rx/Tx Port) 302 is used as an output port (Tx Port). A separately provided input only port (Rx Port) 304 is used as an input port (Rx Port).

The transceiver 210 may transmit and receive signals in a 5-6 GHz band by controlling switching using a single LNA 320, a plurality of RF switches (a first switch (SW1) through a fifth switch (SW5)), and two pins (the input/output common port (Rx/Tx Port) 302 and the input only port 304).

Figure 3:
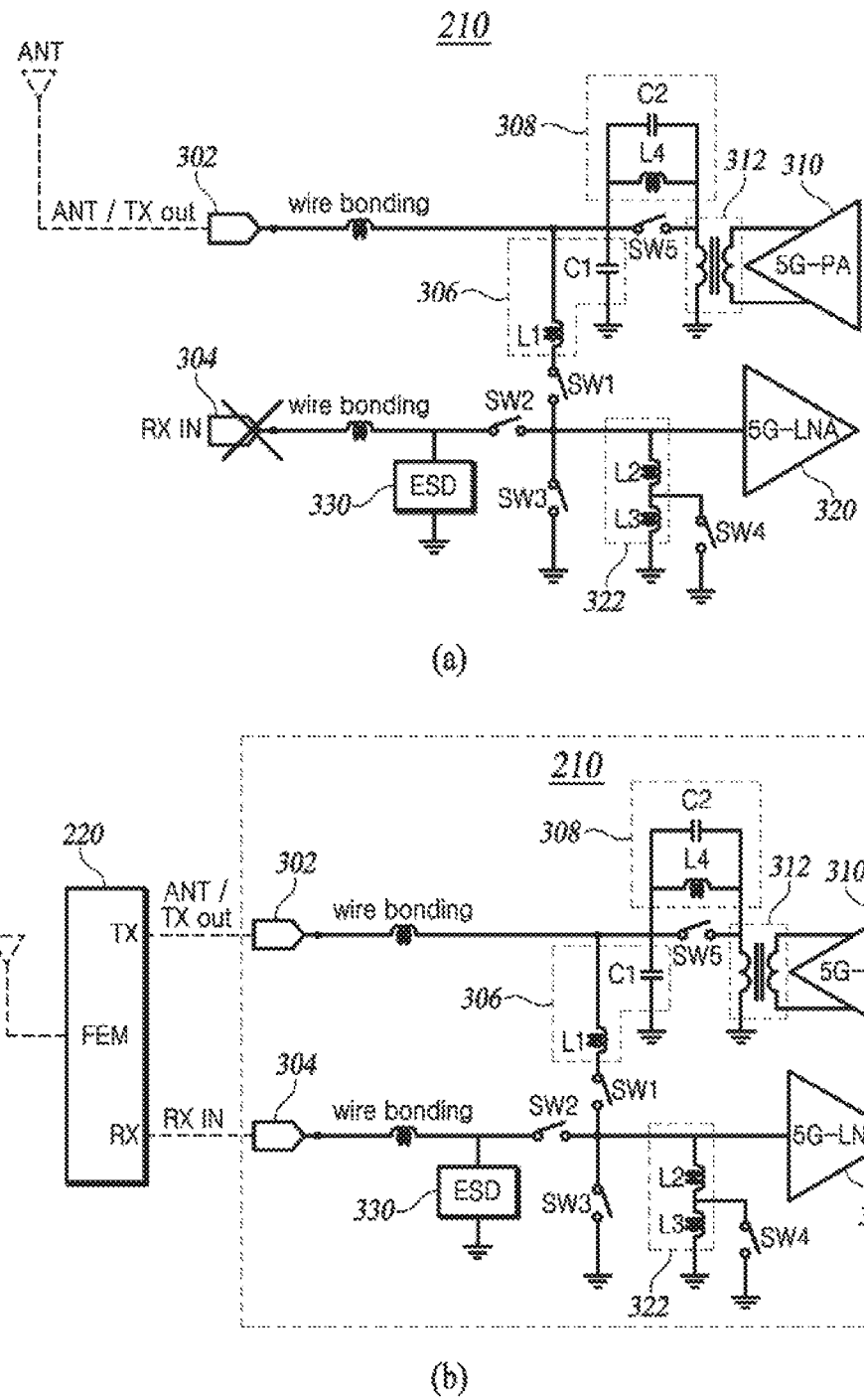
FIG. 3 illustrates an internal circuit diagram of a transceiver according to an exemplary embodiment.

FIG. 3 illustrates an internal circuit diagram of a transceiver according to an exemplary embodiment.

The transceiver 210 of the transceiver module 200 includes the input/output common port (Rx/Tx Port) 302, the input only port (Rx Port) 304, a first resonance circuit 306, a second resonance circuit 308, a low-noise amplifier (LNA) 310, a transformer 312, the power amplifier (PA) 320, a shunt circuit 322, an electrostatic discharge (ESD) circuit 330, a first capacitor (C1), a second capacitor (C2), a first inductor (L1), a second inductor (L2), a third inductor (L3), a fourth inductor (L4), the first switch (SW1), the second switch (SW2), the third switch (SW3), the fourth switch (SW4), and the fifth switch (SW5). The elements included in the transceiver 210 are not necessarily limited to said elements.

The transceiver module 200 shown in (a) of FIG. 3 is implemented without the FEM 220. The transceiver module 200 shown in (b) of FIG. 3 is implemented to include the FEM 220. Based on whether the transceiver module 200 includes the FEM 220, a position of an Rx input port of the transceiver 210 changes.

When the transceiver module 200 includes the FEM 220, an antenna port (the input/output common port 302) of the transceiver connects to a Tx input port of the FEM 220, and the separate Rx port 304 connects to an Rx output port of the FEM 220.

The FEM 220 includes an LNA and a PA being embedded and thus, increases the performance of transceiver chips, and typically includes RF switches. Accordingly, the FEM 220 has an antenna port, a Tx port, and an Rx port.

Since the transceiver 210 includes the RF switches (the first switch (SW1) through the fifth switch (SW5)) therein, the number of external RF switch devices may be reduced when the antenna (ANT) connects directly to the transceiver 210 without the FEM 220, as shown in (a) of FIG. 3. The RF switches (the first switch (SW1) through the fifth switch (SW5)) are switched so that an input port of a receiver (Rx) and an output port of a transmitter (Tx) are combined into a single port so as to connect to the antenna (ANT).

The transceiver 210 includes switches (the first switch (SW1) and the second switch (SW2)) used to receive two inputs using the single LNA 320, and separate switches (the third switch (SW3), the fourth switch (SW4), and the fifth switch (SW5)). The transceiver 210 includes shunt inductors (L2 and L3) to compensate for a large quantity of parasitic capacitance occurring by separately switching the plurality of RF switches (the first switch (SW1) through the fifth switch (SW5)).

To guarantee the ESD performance, the transceiver 210 connects the ESD circuit 330 to an input path formed by the input only port 304, and connects the fourth inductor (L4) and an inductor in the transformer 312 to an input path formed by the input/output common port (Rx/Tx Port) 302. The ESD circuit 330 includes a plurality of rectifying devices, and a plurality of resistors.

The input/output common port 302 receives an Rx signal or outputs a Tx signal by connecting to the antenna (ANT).

The input/output common port 302 outputs the Tx signal by connecting to a Tx input terminal of the FEM 220.

The input only port 304 connects to an Rx output port of the FEM 220. The input only port 304 receives the Rx signal from the Rx output port of the FEM 220.

The PA 310 forms a Tx path 510 by connecting to the input/output common port 302, and applies a Tx signal to the input/output common port using the Tx path 510.

The LNA 320 forms a plurality of Rx paths (a first Rx path 410 and a second Rx path 610) by connecting to the input/output common port 302 and the input only port 304 respectively. The LNA 320 amplifies and outputs the Rx signal after receiving the Rx signal using the plurality of Rx paths (the first Rx path 410 and the second Rx path 610).

The plurality of switching devices (the first switch (SW1) through the fifth switch (SW5)) connect between the PA 310 and the LNA 320 and between the input/output common port 302 and the input only port 304 respectively. The plurality of switching devices (the first switch (SW1) through the fifth switch (SW5)) form the Tx path 510 and the plurality of Rx paths (the first Rx path 410 and the second Rx path 610) by performing switching between the PA 310 and the LNA 320 and between the input/output common port 302 and the input only port 304 respectively.

The first and second switches (SW1 and SW2) are switched to determine an input path of an input signal. The third and fifth switches (SW3 and SW5) operate for RF switching and, in case of a Tx operation, are all switched ON so that the Tx signal is connected to a Tx path and an application of the signal to the LNA 320 is prevented. The fourth switch (SW4) performs a role of changing impedance matching using the two input ports (the input/output common port 302 and the input only port 304). The shunt inductors (L2+L3) change the impedance matching by changing inductance in response to switching of the fourth switch (SW4).

The first resonance circuit 306 and the first switch (SW1) are included between the input/output common port 302 and the LNA 320.

The first resonance circuit 306 includes the first inductor (L1) and the first capacitor (C1).

One end of the first inductor (L1) connects to a contact of the input/output common port 302 and the first capacitor (C1). The other end of the first inductor (L1) connects to one end of the first switch (SW1).

One end of the first capacitor (C1) connects to a contact of the input/output common port 302 and the one end of the first inductor (L1). The other end of the first capacitor (C1) connects to the ground.

The first resonance circuit 306 and the first switch (SW1) are included between the input/output common port 302 and the LNA 320.

One end of the first switch (SW1) connects to the other end of the first inductor (L1). The other end of the first switch (SW1) connects to a contact of an input terminal of the LNA 320 and the other end of the second switch (SW2). The other end of the first switch (SW1) also connects to one end of the third switch (SW3).

The second resonance circuit 308 and the fifth switch (SW5) are included between the input/output common port 302 and the PA 310.

The second resonance circuit 308 includes the second capacitor (C2) and the fourth inductor (L4).

One end of the second capacitor (C2) connects to a contact of the one end of the first capacitor (C1) and one end of the fourth inductor (L4). The other end of the second capacitor (C2) connects to a contact of the other end of the fourth inductor (L4) and the other end of the fifth switch (SW5).

The one end of the fourth inductor (L4) connects to a contact of the one end of the first capacitor (C1) and the one end of the second capacitor (C2). The other end of the fourth inductor (L4) connects to a contact of the other end of the fifth switch (SW) and one end of a secondary side of the transformer 312.

One end of the fifth switch (SW5) connects to the one end of the first capacitor (C1). The other end of the fifth switch (SW5) connects to the one end of the secondary side of the transformer 312.

The transformer 312 is included between the PA 310 and the fifth switch (SW5).

Both ends of a primary side of the transformer 312 connect to the PA 310. The one end of the secondary side of the transformer 312 connects to a contact of the fifth switch (SW5) and the other end of the fourth inductor (L4). The other end of the secondary side of the transformer 312 connects to the ground.

The third switch (SW3), the fourth switch (SW4), and the shunt circuit 322 are included between the first resonance circuit 306 and the LNA 320. The ESD circuit 330, the third switch (SW3), the shunt circuit 322, and the fourth switch (SW4) are included between the input only port 304 and the LNA 320.

One end of the ESD circuit 330 connects to a contact of the input only port 304 and one end of the second switch (SW2). The other end of the ESD circuit 330 connects to the ground.

The second switch (SW2) is included between the input only port 304 and the LNA 320.

The one end of the second switch (SW2) connects to the input only port 304. The other end of the second switch (SW2) connects to the input terminal of the LNA 320.

The one end of the third switch (SW3) connects to the other end of the first switch (SW1). Further, the one end of the third switch (SW3) connects to a contact of the other end of the second switch (SW2) and an input terminal of the FEM 220. The other end of the third switch (SW3) connects to the ground.

The shunt circuit 322 includes the second inductor (L2) and the third inductor (L3).

One end of the second inductor (L2) connects to a contact of the other end of the first switch (SW1) and the one end of the third switch (SW3). Further, the one end of the second inductor (L2) connects to a contact of the other end of the second switch (SW2) and the input terminal of the LNA 320. The other end of the second inductor (L2) connects to one end of the third inductor (L3).

The one end of the third inductor (L3) connects to the other end of the second inductor (L2). The other end of the third inductor (L3) connects to the ground.

One end of the fourth switch (SW4) connects to a contact of the other end of the second inductor (L2) and the one end of the third inductor (L3). The other end of the fourth switch (SW4) connects to the ground.

In case of an Rx mode operation while the input/output common port 302 connects directly to the antenna (ANT), when the first switch (SW1) is switched ON, the Rx signal received from the antenna (ANT) connecting to the input/output common port 302 is inputted into the LNA 320 along the first Rx path 410 via the input/output common port 302, the first inductor (L1), and the first switch (SW1).

In case of the Rx mode operation while the input/output common port 302 connects directly to the antenna (ANT), when the fifth switch (SW5) is switched OFF, the connection with the PA 310 is severed, and a high impedance is formed due to a resonance between the fourth inductor (L4) and the second capacitor (C2) so that an inflow of noise outputted from the PA 310 into the LNA 320 is blocked.

In case of a Tx mode operation while the input/output common port 302 connects directly to the antenna (ANT), the fifth switch (SW5) is switched ON, and a power signal, which is an input signal amplified by the PA 310, is outputted to the primary side of the transformer 312. The transformer 312 generates a Tx signal by applying a current applied to the primary side to the secondary side based on an Input/output voltage ratio according to a preset turn ratio. The Tx signal is outputted to the input/output common port 302 along the Tx path 510 via the PA 310, the transformer 312, and the fifth switch (SW5).

In case of the Tx mode operation while the input/output common port 302 connects directly to the antenna (ANT), when the first switch (SW1) and the third switch (SW3) are switched ON, and when the fourth switch (SW4) is switched ON or OFF, a high impedance is formed due to a resonance between the first inductor (L1) and the first capacitor (C1) so that an inflow of the Tx signal into the LNA 320 is prevented.

In case of an Rx mode operation while the input only port 304 connects to the FEM 220, the third switch (SW3) is switched OFF, and the fourth switch (SW4) is switched ON so that a parasitic capacitance formed on the second Rx path 610 is compensated by the second inductor (L2) and the third inductor (L3).

In case of the Rx mode operation while the input only port 304 connects to the FEM 220, when the second switch (SW2) is switched ON, the Rx signal received from the input terminal of the FEM 220 connecting to the input only port 304 is inputted into the LNA 320 along the second Rx path 610 via the input only port 304 and the second switch (SW2).

In case of the Rx mode operation while the input only port 304 connects to the FEM 220, when the fifth switch (SW5) is switched OFF, the connection with the PA 310 is severed, and a high impedance is formed due to a resonance between the fourth inductor (L4) and the second capacitor (C2) so that an inflow of noise outputted from the PA 310 into the LNA 320 is blocked.

In case of a Tx mode operation while the input/output common port 302 connects to the FEM 220, the fifth switch (SW5) is switched ON, and a power signal, which is an input signal amplified by the PA 310, is outputted to the primary side of the transformer 312. The transformer 312 generates a Tx signal by applying a current applied to the primary side to the secondary side based on an input/output voltage radio according to a preset turn ratio. The Tx signal is outputted to the input/output common port 302 along the Tx path 510 via the PA 310, the transformer 312, and the fifth switch (SW5).

In case of the Tx mode operation while the input/output common port 302 connects to the FEM 220, when the first switch (SW1) and the third switch (SW3) are switched ON, and when the fourth switch (SW4) is switched ON or OFF, a high impedance is formed due to a resonance between the first inductor (L1) and the first capacitor (C1) so that an inflow of the Tx signal into the LNA 320 is prevented.

Figure 4:
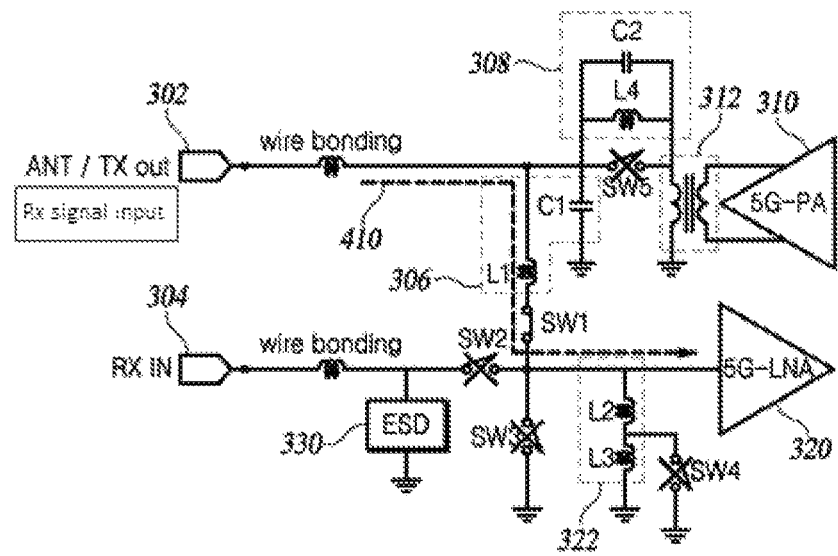
FIG. 4 describes a method of operating in an Rx mode when an antenna connects directly to a transceiver according to an exemplary embodiment.
Figure 4:
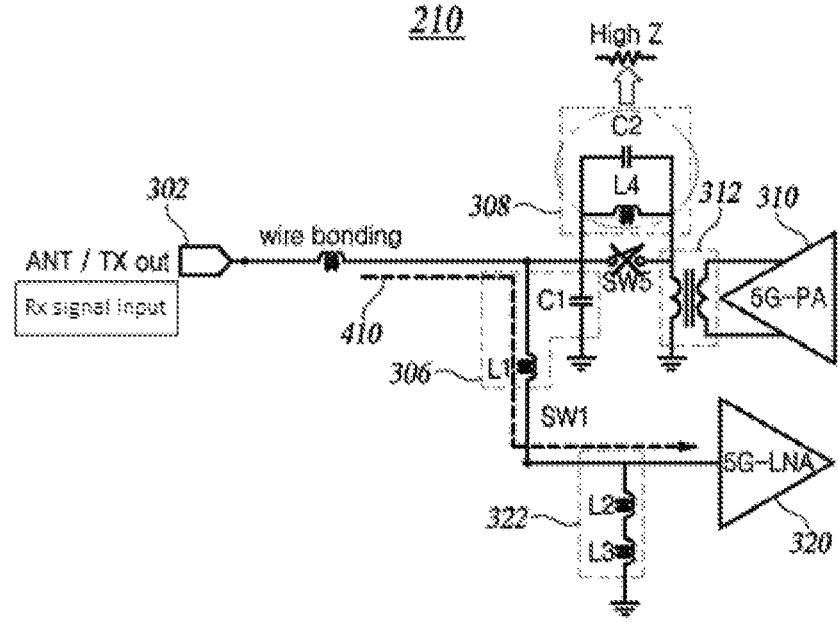

FIG. 4 describes a method of operating in an Rx mode when an antenna connects directly to a transceiver according to an exemplary embodiment.

FIG. 4 describes a method in which the antenna (ANT) connects directly to the transceiver 210 without the FEM 220 and operates in an Rx mode. When the input/output common port 302 connects directly to the antenna (ANT), the transceiver 210 does not use the input only port 304.

When the antenna (ANT) connects directly to the transceiver 210 without the FEM 220 and operates in the Rx mode, the transceiver module 200 performs an RF switching operation, as shown in (a) of FIG. 4.

The first switch (SW1) in the transceiver 210 is switched ON, and the second switch (SW2), the third switch (SW3), the fourth switch (SW4), and the fifth switch (SW5) are switched OFF.

Since the antenna (ANT) connects directly to the input/output common port 302, the input/output common port 302 receives an Rx signal from the antenna (ANT). Since the first switch (SW1) is switched ON, and since the second switch (SW2), the third switch (SW3), the fourth switch (SW4), and the fifth switch (SW5) are switched OFF, the Rx signal inputted from the input/output common port 302 is applied to the LNA 320 via the first inductor (L1) and via the first switch (SW1). The first switch (SW1) is switched to determine an input path of the Rx signal inputted from the input/output common port 302.

As shown in (b) of FIG. 4, when the fifth switch (SW5) is switched OFF, the second capacitor (C2) includes a parasitic capacitance, and thus the second capacitor (C2) and the fourth inductor (L4) are required for resonance at an operating frequency.

In case of an Rx mode operation, when the fifth switch (SW5) is switched OFF, a high impedance is formed due to a resonance between the fourth inductor (L4) and the second capacitor (C2). Due to the fifth switch (SW5) being switched OFF and the resonance between the fourth inductor (L4) and the second capacitor (C2), an inflow of PA Off-state noise outputted from the PA 310 into the LNA 320 is blocked. Further, when the fifth switch (SW5) is switched OFF and when the fourth inductor (L4) and the second capacitor (C2) resonate, a leakage of the Rx signal inputted from the input/output common port 302 connecting directly to the antenna (ANT) into the PA 310 is blocked.

Figure 5:
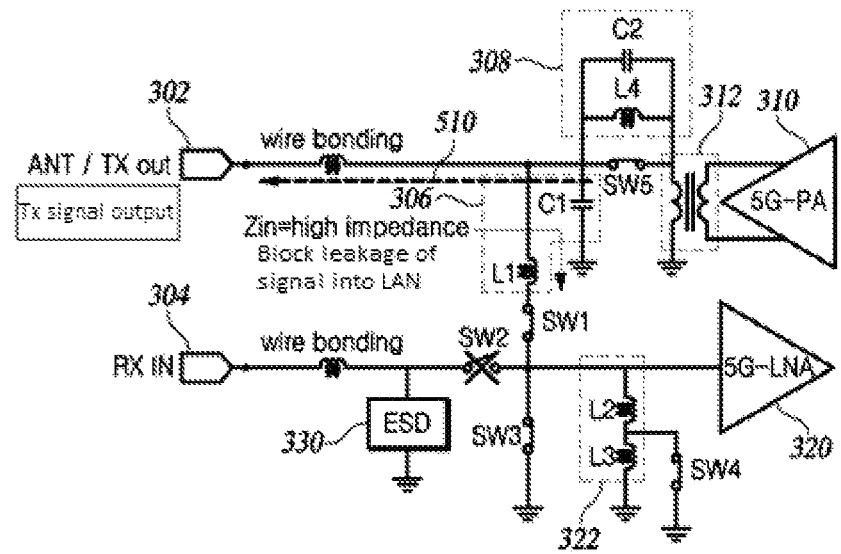
FIG. 5 describes a method of operating in a Tx mode when an antenna connects directly to a transceiver according to an exemplary embodiment.
Figure 5:
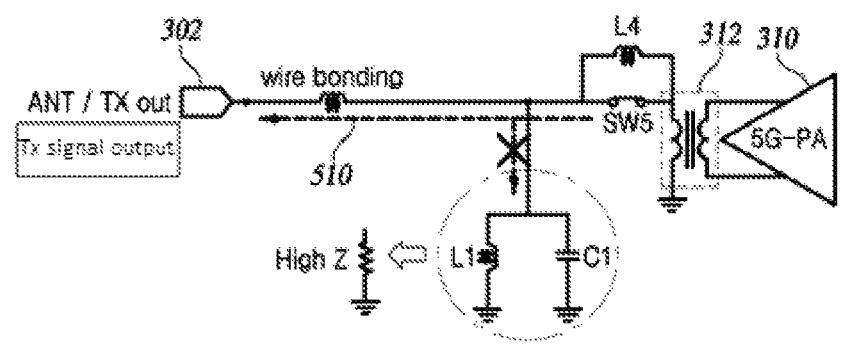

FIG. 5 describes a method of operating in a Tx mode when an antenna connects directly to a transceiver according to an exemplary embodiment.

FIG. 5 describes a method in which the antenna (ANT) connects directly to the transceiver 210 without the FEM 220 and operates in a Tx mode. When the input/output common port 302 connects directly to the antenna (ANT), the transceiver 210 does not use the input only port 304.

When the antenna (ANT) connects directly to the transceiver 210 without the FEM 220 and operates in the Tx mode, the transceiver module 200 performs an RF switching operation, as shown in (a) of FIG. 5.

The first switch (SW1), the third switch (SW3), the fourth switch (SW4), and the fifth switch (SW5) in the transceiver 210 are switched ON, and only the second switch (SW2) is switched OFF.

Since the antenna (ANT) connects directly to the input/output common port 302, the input/output common port 302 receives a Tx signal from the PA 310. The PA 310 outputs, to the primary side of the transformer 312, a power signal, which is a driver signal inputted into the PA 310 and amplified by the PA 310 using a DC-DC voltage or a battery voltage received from a power source, as power.

Both ends of the primary side of the transformer 312 connect to the PA 310. The one end of the primary side of the transformer 312 connects to the other end of the fifth switch (SW5), and the other end of the primary side of the transformer 312 connects to the ground.

The transformer 312 outputs a current applied to the primary side to the secondary side based on an input/output voltage ratio according to a preset turn ratio. That is, the transformer 312 outputs the current applied to the primary side by the PA 310 to the fifth switch (SW5) connecting to the secondary side based on the input/output voltage ratio according to the preset turn ratio.

Since the fifth switch (SW5) is switched ON, the Tx signal outputted via the PA 310 and via the transformer 312 is inputted into the input/output common port 302 and outputted to the antenna (ANT).

As shown in (b) of FIG. 5, in addition to the fifth switch (SW5), the first switch (SW1), the third switch (SW3), and the fourth switch (SW4) are also switched ON. However, the first inductor (L1) and the first capacitor (C1) form a resonance circuit together and block an inflow of the output Tx signal into the LNA 320 when the fifth switch (SW5) is switched ON.

That is, in case of the Tx mode operation, when the antenna (ANT) connects directly to the input/output common port 302, the first inductor (L1) forms a resonance circuit with the first capacitor (C1) and thereby prevents an inflow of the Tx signal into the LNA 320.

Figure 6:
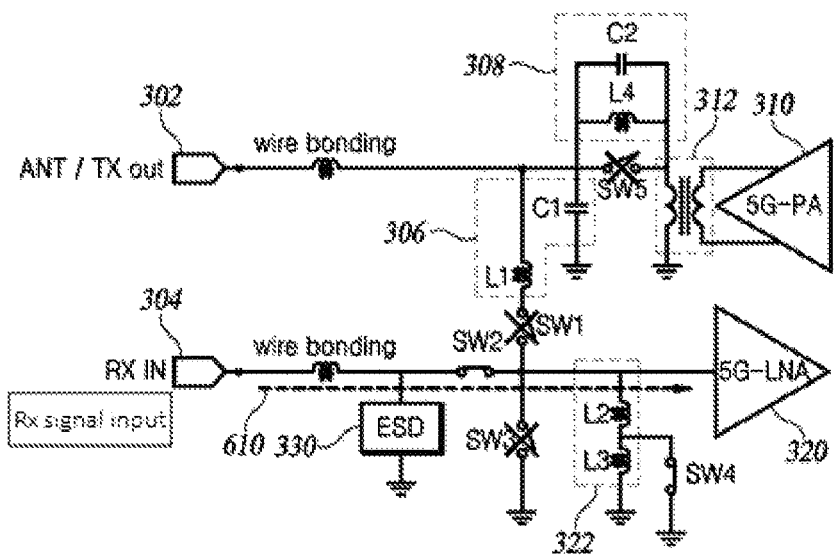
FIG. 6 describes a method of operating in an Rx mode when an FEM connects to a transceiver according to an exemplary embodiment.
Figure 6:
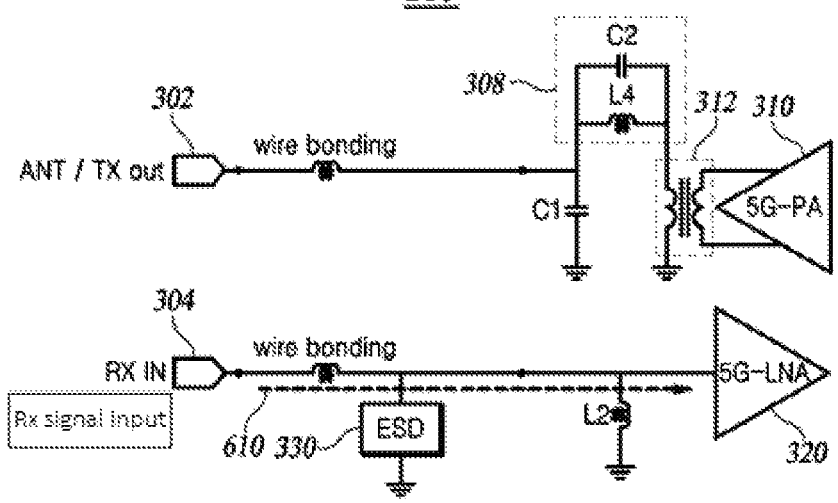

FIG. 6 describes a method of operating in an Rx mode when an FEM connects to a transceiver according to an exemplary embodiment.

FIG. 6 describes a method in which the FEM 220 connects to the transceiver 210 and operates in an Rx mode. The input/output common port 302 connects directly to the Tx input terminal of the FEM 220, and the input only port 304 connects to an Rx output terminal of the FEM 220.

When the antenna (ANT) of the transceiver module 200 connects to an ANT port of the FEM 220, and when the transceiver 210 connects to the TX and RX ports of the FEM 220 and operates in an Rx mode, the transceiver 210 performs an RF switching operation, as shown in (a) of FIG. 6.

The second switch (SW2) and the fourth switch (SW4) in the transceiver 210 are switched ON, and the first switch (SW1), the third switch (SW3), and the fifth switch (SW5) are switched OFF.

Since the input only port 304 of the transceiver 210 connects to the Rx output of the FEM 220, the input only port 304 receives an Rx signal from the FEM 220. Since the second switch (SW2) and the fourth switch (SW4) are switched ON, and since the first switch (SW1), the third switch (SW3), and the fifth switch (SW5) are switched OFF, the Rx signal inputted from the input only port 304 is applied to the LNA 320 via the second switch (SW2). The second switch (SW2) is switched to determine an input path of the Rx signal inputted from the input only port 304.

As shown in (b) of FIG. 6, the first switch (SW1) and the fifth switch (SW5) are switched OFF. Thus, in case of an Rx mode operation, when the fifth switch (SW5) is switched OFF, a high impedance is formed due to a resonance between the fourth inductor (L4) and the second capacitor (C2).

When the fifth switch (SW5) is switched OFF, and when the fourth inductor (L4) and the second capacitor (C2) resonate, an inflow of PA off-state noise outputted from the PA 310 into the LNA 320 is blocked. Further, when the fifth switch (SW5) is switched OFF, when the fourth inductor (L4) and the second capacitor (C2) resonate, and when the Tx output terminal of the FEM 220 connects to the input/output common port 302, a leakage of the Rx signal inputted into the input only port 304 into the PA 310 is blocked.

Figure 7:
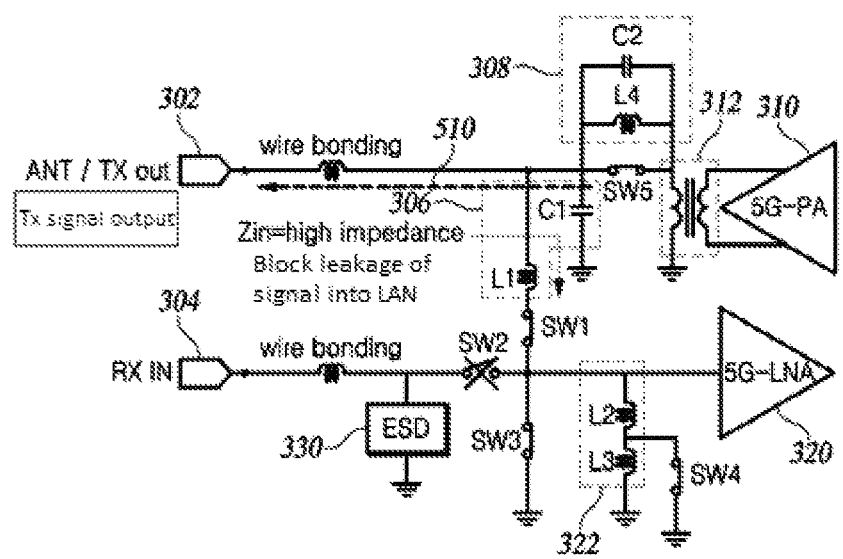
FIG. 7 describes a method of operating in a Tx mode when an FEM connects to a transceiver according to an exemplary embodiment.
Figure 7:
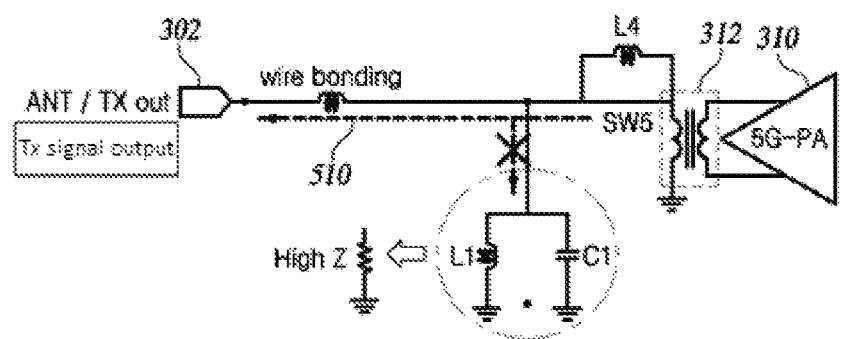

FIG. 7 describes a method of operating in a Tx mode when an FEM connects to a transceiver according to an exemplary embodiment.

FIG. 7 describes a method in which the antenna (ANT) of the transceiver module 200 connects to the ANT port of the FEM 220, and the transceiver 210 connects to the TX and RX ports of the FEM 220 and operates in a Tx mode. The input/output common port 302 connects directly to the Tx input terminal of the FEM 220, and the input only port 304 connects directly to the Rx output terminal of the FEM 220.

When the antenna (ANT) of the transceiver module 200 connects to the ANT port of the FEM 220, and when the transceiver 210 connects to the TX and RX ports of the FEM 220 and operates in the Tx mode, the transceiver 210 performs an RF switching operation, as shown in (a) of FIG. 7.

The first switch (SW1), the third switch (SW3), the fourth switch (SW4), and the fifth switch (SW5) in the transceiver module 200 are switched ON, and only the second switch (SW2) is switched OFF. Since the input/output common port 302 connects to the Tx input terminal of the FEM 220, the input/output common port 302 applies a Tx signal inputted from the PA 310 to the Tx input terminal of the FEM 220.

The PA 310 outputs, to the primary side of the transformer 312, a power signal, which is a driver signal inputted into the PA 310 and amplified by the PA 310 using a DC-DC voltage or a battery voltage received from a power source, as power.

Both ends of the primary side of the transformer 312 connect to the PA 310. The one end of the primary side of the transformer 312 connects to the other end of the fifth switch (SW5), and the other end of the primary side of the transformer 312 connects to the ground. The transformer 312 outputs a current applied to the primary side to the secondary side based on an input/output voltage ratio according to a preset turn ratio. That is, the transformer 312 outputs the current applied to the primary side by the PA 310 to the fifth switch (SW5) connecting to the secondary side based on the input/output voltage ratio according to the preset turn ratio.

Since the fifth switch (SW5) is switched ON, the Tx signal outputted via the PA 310 and via the transformer 312 is inputted into the input/output common port 302 and outputted to the Tx input terminal of the FEM 220.

As shown in (b) of FIG. 7, in addition to the fifth switch (SW5), the first switch (SW1), the third switch (SW3), and the fourth switch (SW4) are also switched ON. However, the first inductor (L1) and the first capacitor (C1) form a resonance circuit together, and the fifth switch (SW5) is switched ON so that an inflow of the outputted Tx signal into the LNA 320 is prevented.

That is, in case of the Tx mode operation, when the Tx output terminal of the FEM 220 connects directly to the input/output common port 302, the first inductor (L1) forms a resonance circuit with the first capacitor (C1) and thereby prevents an inflow of the Tx signal into the LNA 320.

Figure 8:
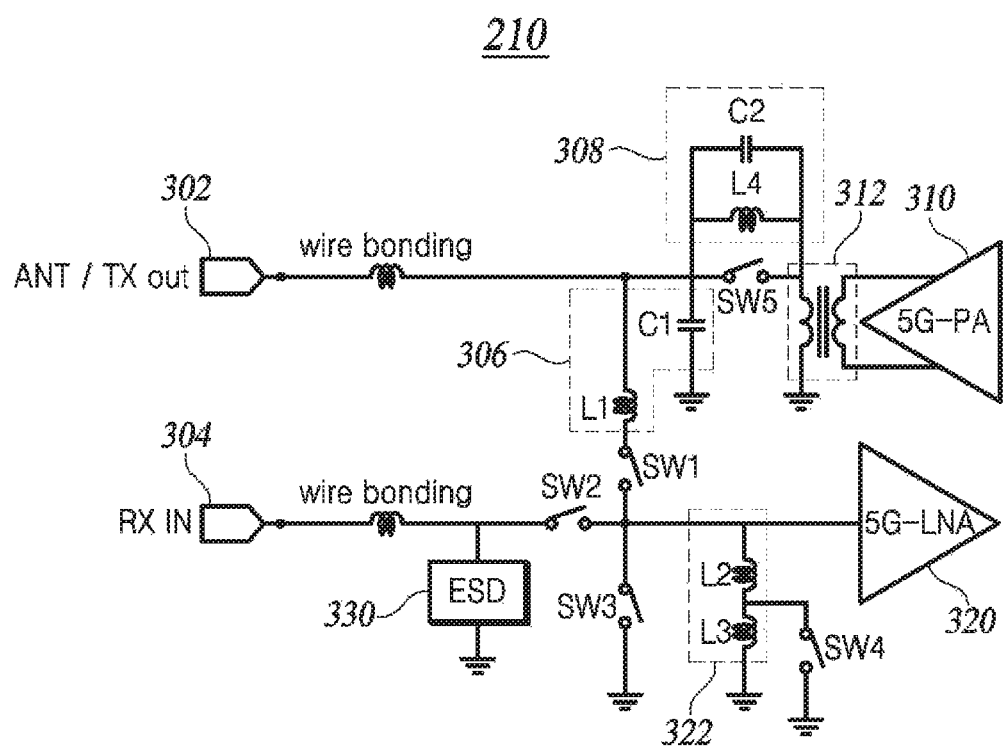
FIG. 8 describes an internal device with a transceiver circuit according to an exemplary embodiment.

FIG. 8 describes an internal device with a transceiver circuit according to an exemplary embodiment.

In case of an Rx mode operation, when the input/output common port 302 connects directly to the antenna (ANT), the first inductor (L1) operates as a matching device with the first capacitor (C1).

In case of a Tx mode operation, when the antenna (ANT) connects directly to the input/output common port 302, the first inductor (L1) forms a resonance circuit with the first capacitor (C1) and thereby prevents an inflow of a Tx signal into the LNA 320.

The second inductor (L2) and the third inductor (L3) perform a function to compensate for a parasitic capacitance when the multiple switches (the first switch (SW1) and the second switch (SW2)) are switched ON.

In case of the Rx mode operation, the second inductor (L2) and the third inductor (L3) require different impedance values when the antenna (ANT) connects directly to the input/output common port 302 and when the Rx output terminal of the FEM 220 connects to the Rx input only port 304. Thus, the impedance values are adjusted by controlling the fourth switch (SW4) to be switched ON or OFF.

The second capacitor (C2) is a capacitor which includes a parasitic capacitance and is required for resonance at an operating frequency with the fourth inductor (L4) when the fifth switch (SW5) is switched OFF.

That is, in the Rx mode operation while the antenna (ANT) connects directly to the input/output common port 302, when the fifth switch (SW5) is switched OFF, a high impedance is formed due to a resonance between the fourth inductor (L4) and the second capacitor (C2).

When the fifth switch (SW5) is switched OFF, and when the fourth inductor (L4) and the second capacitor (C2) resonate, an inflow of PA off-state noise outputted from the PA 310 into the LNA 320 is blocked. Further, when the fifth switch (SW5) is switched OFF, and when the fourth inductor (L4) and the second capacitor (C2) resonate, a leakage of an Rx signal inputted from the input/output common port 302 connecting directly to the antenna (ANT) into the PA 310 is blocked.

Although exemplary embodiments for exemplifying the technical spirit of the present disclosure have been described and shown above, those who have ordinary skill in the art would appreciate that various changes and modifications can be made without departing from the technical spirit. Therefore, the description of the exemplary embodiments is intended to be illustrative, and not to limit the scope of the technical spirit. The scope of the disclosure is defined not by the description, but by the claims and their equivalents, and all variations within the scope of the claims and their equivalents are to be construed as being included in the disclosure.

DESCRIPTION OF REFERENCE NUMERALS

| | |
|---|---|
| 200: Transceiver module | |
| 210: Transceiver | 220: Front-end module (FEM) |
| 302: Input/output common port (Rx/Tx Port) | 304: Input only port (Rx Port) |
| 306: First resonance circuit | 308: Second resonance circuit |
| 310: Power amplifier (PA) | |
| 312: Transformer | |
| 320: Low-noise amplifier (LNA) | |
| 322: Shunt circuit | |
| 330: Electrostatic discharge (ESD) circuit | |
| 410: First Rx path | |
| 510: Tx path | |
| 610: Second Rx path | |
| C1: First capacitor | C2: Second capacitor |
| L1: First inductor | L2: Second inductor |
| L3: Third inductor | L4: Fourth inductor |
| SW1: First switch | SW2: Second switch |
| SW3: Third switch | SW4: Fourth switch |
| SW5: Fifth switch | |

What is claimed is:

1. A transceiver, comprising:
an input/output common port configured to receive an Rx signal or to output a Tx signal by connecting to an antenna (ANT), or to output the Tx signal by connecting to a Tx input terminal of a front-end module (FEM);
an input only port configured to receive the Rx signal by connecting to an Rx output terminal of the FEM;
a low-noise amplifier (LNA) configured to form a first Rx path by connecting to the input/output common port or a second Rx path by connecting to the input only port, and configured to amplify and output the Rx signal after receiving the Rx signal using the first Rx path or the second Rx path;
a power amplifier (PA) configured to form a Tx path by connecting to the input/output common port, and configured to apply the Tx signal to the input/output common port using the Tx path;
a plurality of switching devices configured to selectively form the Tx path between the input/output common port and the PA, the first Rx path between the input/output common port and the LNA, or the second Rx path between the input only port and the LAN; and
a first resonance circuit and a second resonance circuit configured to form a high impedance for blocking an inflow of a signal outputted from the PA into the LNA when the switching devices forming the Tx path, the first Rx path, or the second Rx path.

2. The transceiver of claim 1,
wherein the switching devices comprise a first switch that has one end connected to an input terminal of the LNA,
wherein the first resonance circuit comprises a first inductor that has one end connected to the input/output common port, and the other end connected to the other end of the first switch; and
and
wherein in case of a first Rx mode operation;
the first switch is switched ON; and
the first Rx path along which the Rx signal, received from the ANT connected to the input/output common port, is inputted into the LNA via the input/output common port, the first inductor, and the first switch is formed.

3. The transceiver of claim 2,
wherein the switching devices further comprise a fifth switch between the input/output common port and the PA,
wherein the second resonance circuit comprises a fourth inductor and a second capacitor that are connected in parallel with the fifth switch,
wherein in case of the first Rx mode operation;
the fifth switch is switched OFF;
the TX path is severed; and
the high impedance is formed due to a resonance between the fourth inductor and the second capacitor so that the inflow of noise outputted from the PA into the LNA is blocked.

4. The transceiver of claim 1, further comprising:
a transformer connected with the PA,
wherein the switching devices comprise a fifth switch between the input/output common port and the transformer, and
wherein in case of a Tx mode operation;
the fifth switch is switched ON;
the PA outputs a power signal to a primary side of the transformer by amplifying an input signal; and
the Tx path along which the Tx signal, generated by applying a secondary current to a secondary side of the transformer based on a primary current applied to the primary side and an input/output voltage ratio according to a preset turn ratio, is outputted to the input/output common port via the PA, the transformer, and the fifth switch is formed.

5. The transceiver of claim 4,
wherein the first resonance circuit comprises:
a first inductor that has one end connected to a contact of the input/output common port and one end of the fifth switch; and
a first capacitor that has one end connected to the one end of the first inductor, and the other end connected to a ground,
wherein the switching devices further comprise:
a first switch that has one end connected to the other end of the first inductor, and the other end connected to an input terminal of the LNA; and
a third switch that has
one end connected to the other end of the first switch, and the other end connects to the ground, and
wherein in case of the Tx mode operation;
the first switch and the third switch are switched ON; and
the high impedance is formed due to a resonance between the first inductor and the first capacitor so that the inflow of the Tx signal into the LNA is prevented.

6. The transceiver of claim 1,
wherein the switching devices comprise a second switch that has one end connected to the input only port and the other end connected to an input terminal of the LNA, and
wherein
in case of a second Rx mode operation;
the second switch is switched ON; and
the second Rx path along which the Rx signal, received from the Rx output terminal of the FEM connected to the input only port, is inputted into the LNA via the input only port and via the second switch is formed.

7. The transceiver of claim 6, further comprising:
an electrostatic discharge (ESD) circuit
having one end connected to a contact of the input only port and the one end of the second switch, and the other end connected to a ground; and
a shunt circuit comprises:
a second inductor that has one end connected to a contact of the other end of the second switch and the input terminal of the LNA; and
a third inductor that has one end connected to the other end of the second inductor, and the other end connected to the ground,
wherein the switching devices further comprise a fourth switch that has one end connected to a contact of the other end of the second inductor and the one end of the third inductor, and the other end connected to the ground, and
wherein in case of the second Rx mode operation, the fourth switch is switched ON so that a parasitic capacitance formed on the second Rx path is compensated by the second inductor.

8. The transceiver of claim 6, wherein the switching devices further comprise a first switch that has one end connected to the input terminal of the LNA, and a fifth switch between the input/output common port and the PA,
wherein the first resonance circuit comprises a first inductor that has one end connected to a contact of the input/output common port and one end of the fifth switch, and the other end connected to the other end of the first switch, wherein the second resonance circuit comprises a fourth inductor and a second capacitor that are connected in parallel with the fifth switch, and wherein in case of the second Rx mode operation;

the first switch and the fifth switch are switched OFF;

the Tx path and the first Rx path are severed; and the high impedance is formed due to a resonance between the fourth inductor and the second capacitor so that the inflow of noise outputted from the PA into the LNA is blocked.

* * * * *